United States Patent [19]
Kawamura

[11] Patent Number: 5,959,487
[45] Date of Patent: Sep. 28, 1999

[54] INTEGRATED CIRCUIT WITH SPEED DETECTOR

[75] Inventor: J. Patrick Kawamura, Richardson, Tex.

[73] Assignee: Texas Instruments Incorporated, Dallas, Tex.

[21] Appl. No.: 08/858,072

[22] Filed: May 16, 1997

Related U.S. Application Data

[60] Provisional application No. 60/017,763, May 16, 1996.

[51] Int. Cl.[6] .................................................. H03H 11/26
[52] U.S. Cl. ............................ 327/270; 327/42; 395/555
[58] Field of Search .............................. 327/42, 269, 270, 327/261, 262; 395/555, 556, 557

[56] References Cited

U.S. PATENT DOCUMENTS

| | | | |
|---|---|---|---|
| 5,049,766 | 9/1991 | Van Driest et al. | 307/603 |
| 5,422,585 | 6/1995 | Fan Chiangi et al. | 327/170 |
| 5,572,719 | 11/1996 | Biesterfeldt | 395/555 |

*Primary Examiner*—Kenneth B. Wells
*Assistant Examiner*—Minh Nguyen
*Attorney, Agent, or Firm*—Robert N. Rountree; Robby T. Holland; Richard L. Donaldson

[57] ABSTRACT

A circuit is designed with a reference circuit (200) for generating a reference signal. The reference signal determines a reference period. A delay circuit (208, 212, 216) responsive to the reference signal produces a delay signal. A control circuit (248, 254, 258, 260, 262) responsive to the delay signal produces a control signal. The delay circuit emulates the speed of an integrated circuit for the reference period. Control signals from the control circuit compensate the integrated circuit performance for measured circuit speed variations.

28 Claims, 9 Drawing Sheets

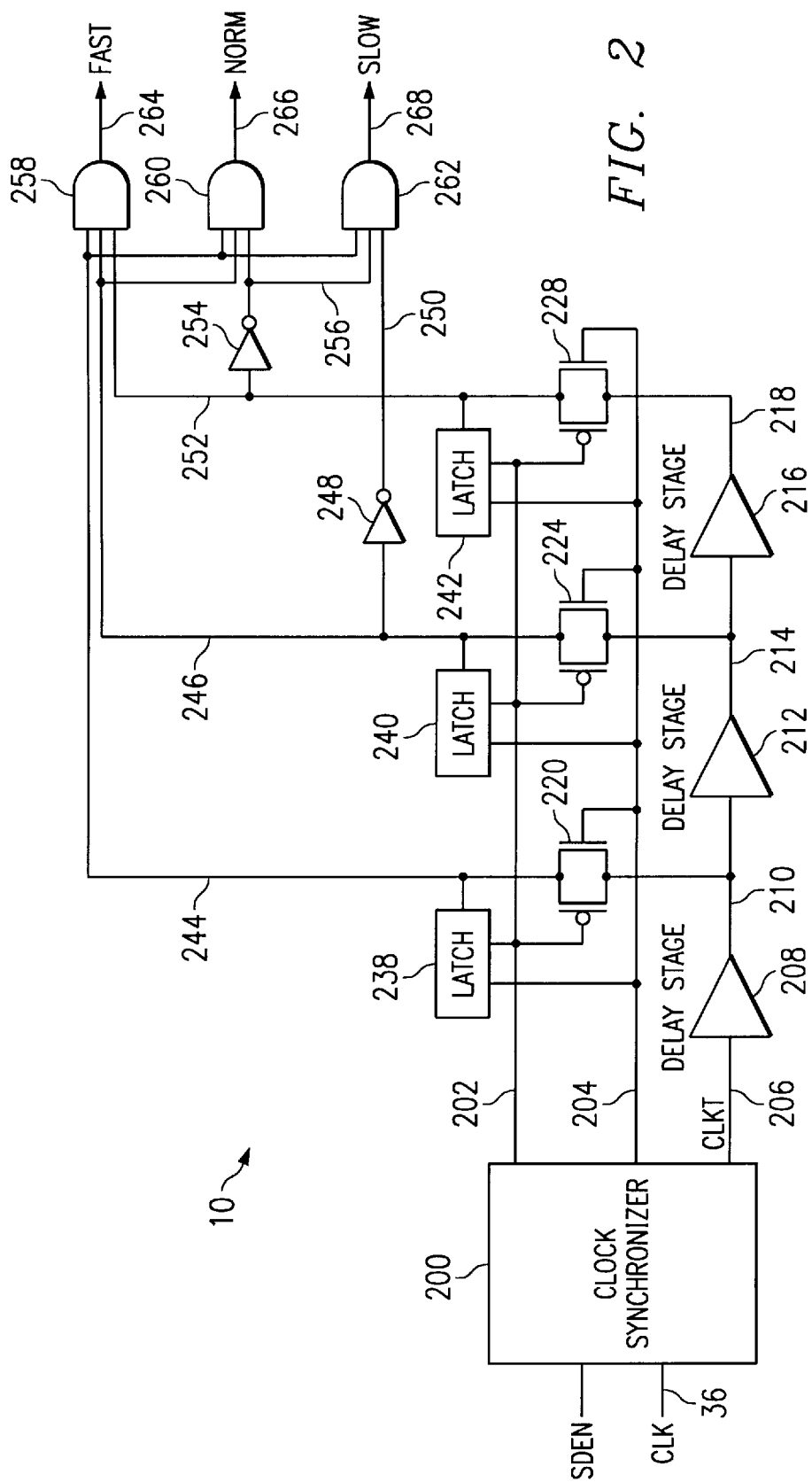

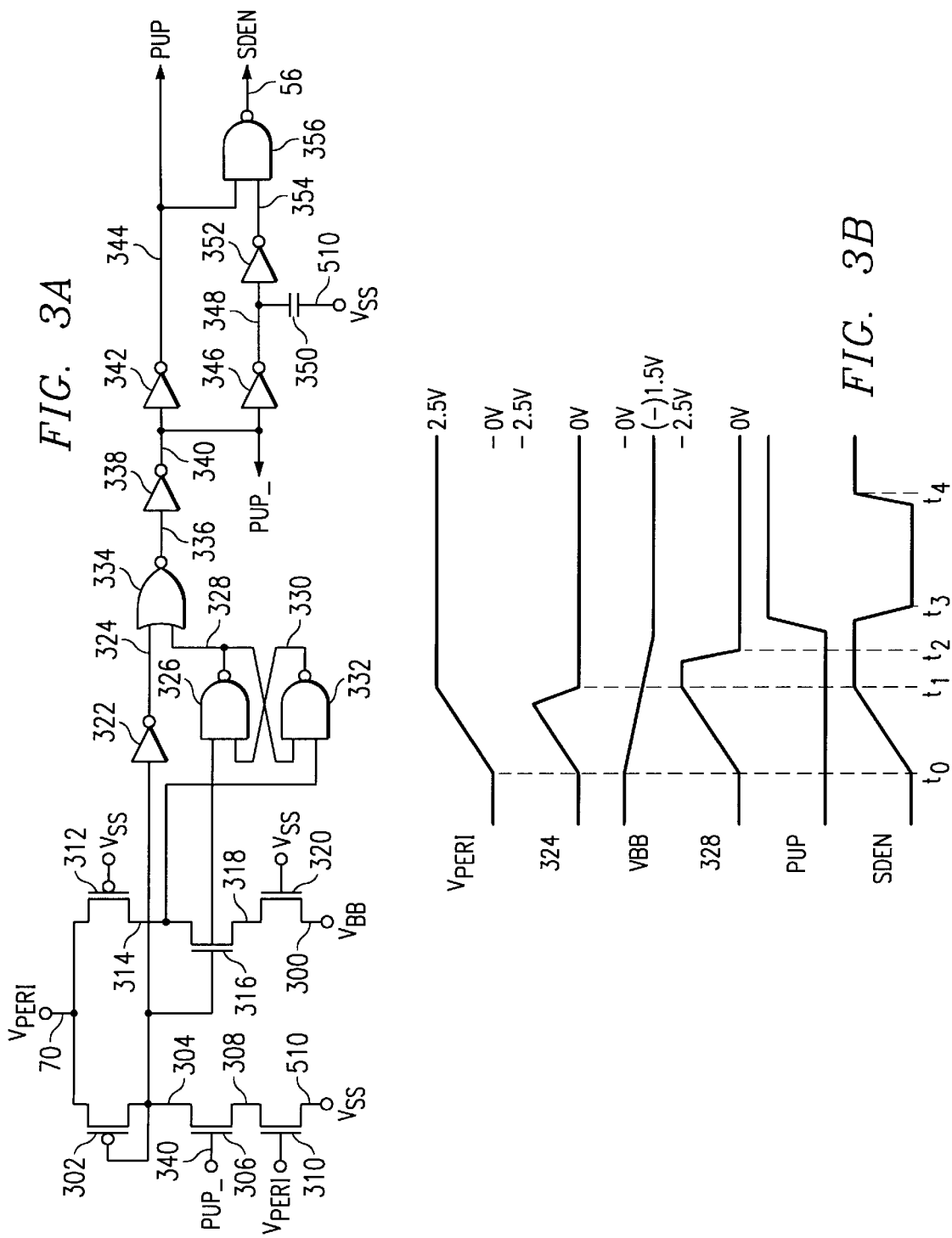

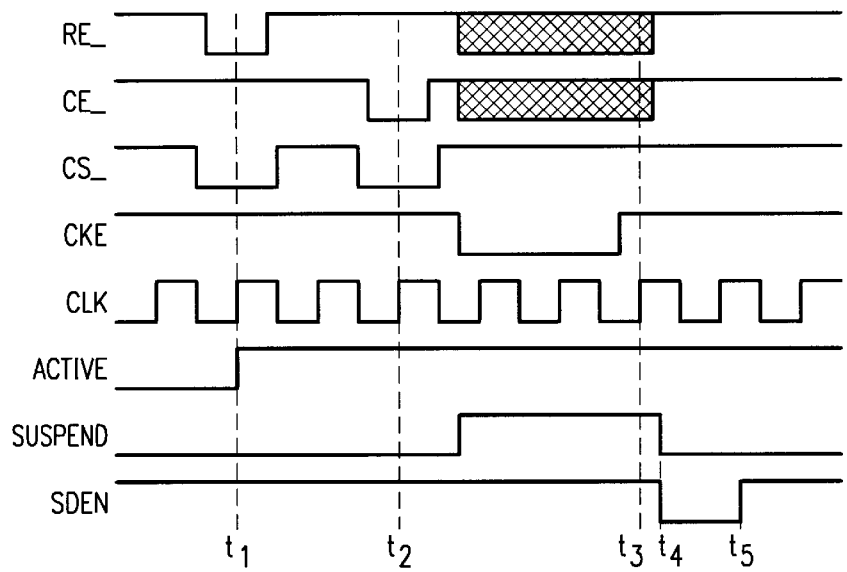
FIG. 11C
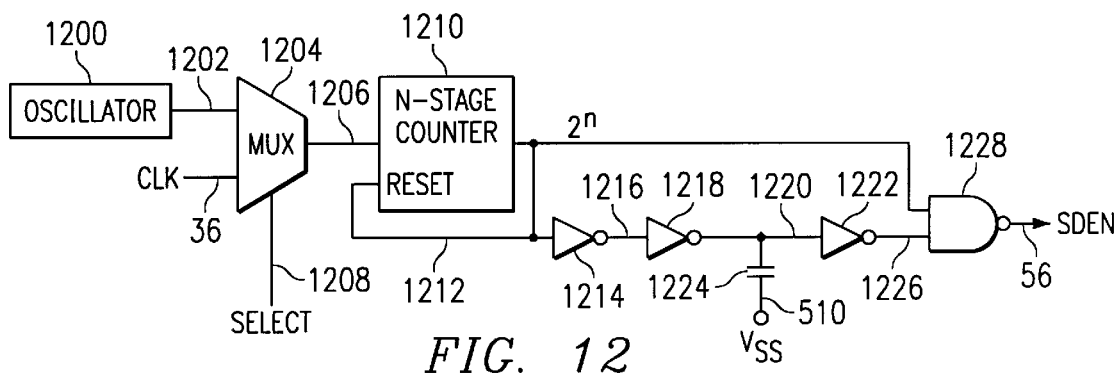
FIG. 12
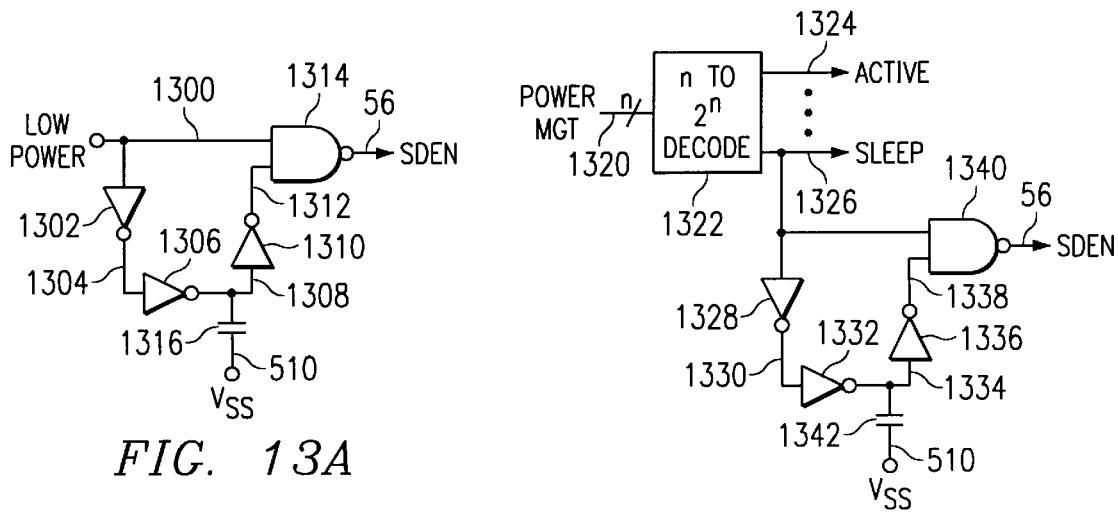
FIG. 13A
FIG. 13B

INTEGRATED CIRCUIT WITH SPEED DETECTOR

This application claims benefit of Provisional Application Ser. No. 60/017763 filed May 16, 1996.

FIELD OF THE INVENTION

This invention relates to an integrated circuit and more particularly to an integrated circuit including a speed detector.

BACKGROUND OF THE INVENTION

Present complementary metal oxide semiconductor (CMOS) dynamic random access memory (DRAM) circuits are frequently used for main memory in a variety of applications including desk top and portable computer systems. Advances in processor and system design require dynamic random access memory devices with high density, low power and fast access time for main memory. These memory devices must operate consistently over a range of physical parameters such as voltage and temperature. Moreover, these memory devices are subject to a statistical range of device parameters inherent in the manufacturing process such as variations in transistor gate length, gate oxide thickness and threshold voltage. These variations result in a distribution of memory devices having different speed and power characteristics. This is a significant design problem because slow device operating conditions, such as low voltage or high temperature, are limited by maximum access time or minimum circuit speed requirements. Alternatively, fast device operating conditions, such as high voltage or low temperature, are limited by maximum power consumption.

Previous memory circuits have employed special delay circuits to compensate for variations in physical parameters as disclosed by U.S. Pat. No. 5,068,553, incorporated herein by reference, wherein a polycrystalline silicon resistor and a capacitor generate a circuit delay having a reduced supply voltage dependence. Application of this circuit, however, is limited to delay circuits. Moreover, it fails to compensate for variations in device characteristics. Thus, the problem of significant distribution of memory devices having different device speed and power characteristics due to variations in physical and device parameters remains unresolved.

SUMMARY OF THE INVENTION

These problems of reducing the distribution of devices having different speed and power characteristics is resolved by a circuit including a reference circuit for generating a reference signal. The reference signal determines a reference period. A delay circuit responsive to the reference signal produces a delay signal. A control circuit is responsive to the delay signal produces a control signal. The control signal controls peripheral circuit operation.

The present invention uses a delay circuit to measure circuit speed over a reference period. A control circuit produces a control signal to control peripheral circuit operation, thereby reducing the distribution of devices having different speed and power characteristics.

BRIEF DESCRIPTION OF THE DRAWINGS

A more complete understanding of the invention may be gained by reading the subsequent detailed description with reference to the drawings wherein:

FIG. 2 is a diagram of an embodiment of a speed detector circuit of the 256 megabit synchronous dynamic random access memory of FIG. 1 according to the instant invention;

FIG. 3A is a schematic diagram of a power-up detector of the 256 megabit dynamic random access memory of FIG. 1;

FIG. 3B is a timing diagram showing a power-up sequence for the power-up detector of FIG. 3A;

FIG. 11C is a timing diagram of the circuit of FIG. 11A showing the activation of the speed detector circuit of FIG. 2 in response to a suspend mode signal;

FIG. 12 is a diagram of an embodiment of the present invention for activation of the speed detector circuit of FIG. 2 in response to a counter signal;

FIG. 13A is a diagram of an embodiment of the present invention for activation of the speed detector circuit of FIG. 2 in response to a low power signal;

FIG. 13B is a diagram of an embodiment of the present invention for activation of the speed detector circuit of FIG. 2 in response to a power management signal;

DETAILED DESCRIPTION OF THE PREFERRED EMBODIMENTS

Figure 1:
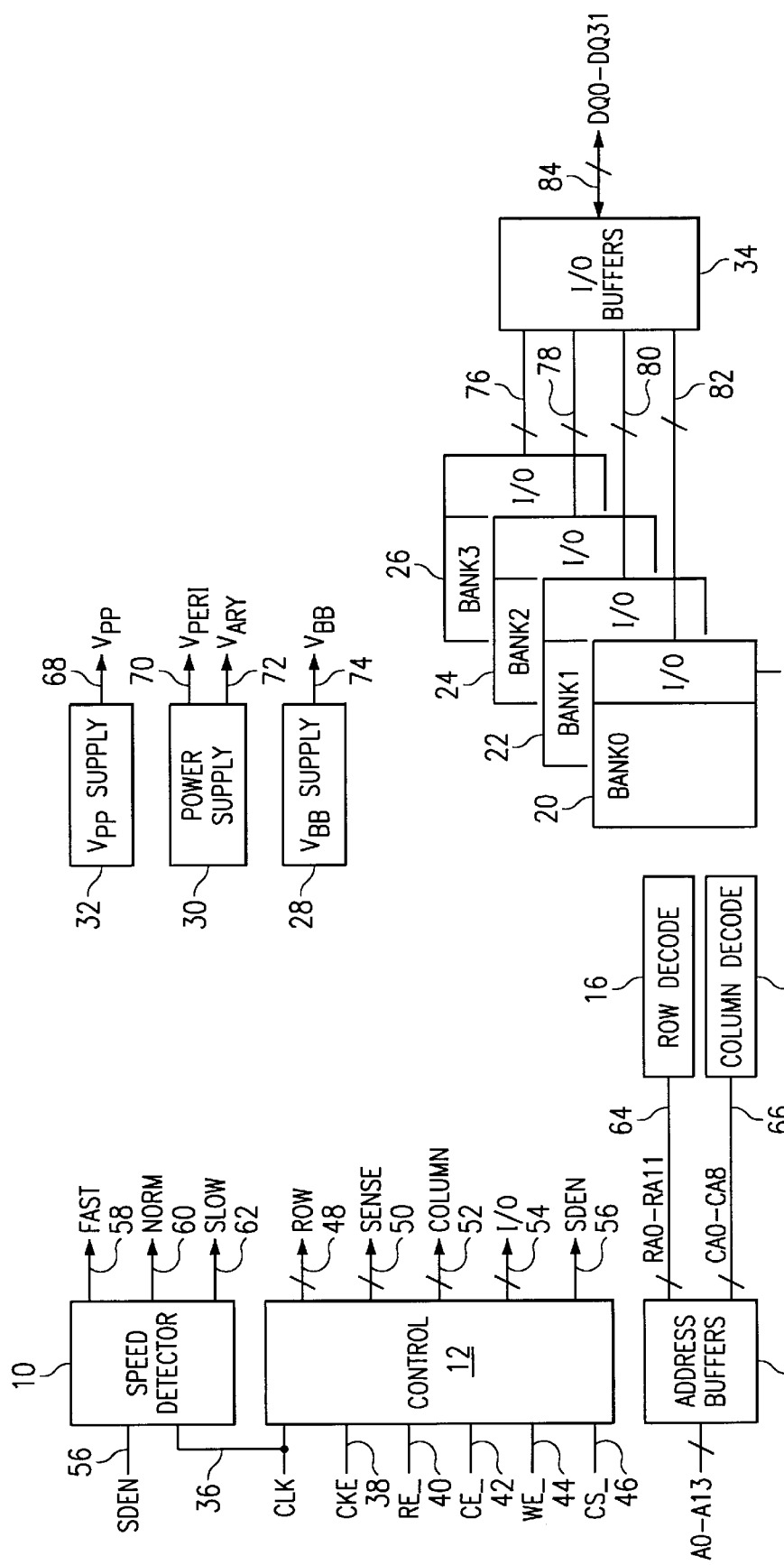
FIG. 1 is a diagram of a 256 megabit synchronous dynamic random access memory having an embodiment of the present invention.

Referring now to FIG. 1, there is a block diagram of a 256 megabit synchronous dynamic random access memory circuit. The memory circuit is organized into 4 banks of 64 megabits of memory cells. Each bank is selected by bank addresses BA0–BA1. Banks are addressed by column decode circuit 18 and row decode circuit 16, including their respective peripheral logic circuits, for selecting plural memory cells from the bank. An input-output (I/O) circuit 34 conducts data between the plural memory cells and output terminals DQ0–DQ31.

Control circuit 12 receives external signals, for example, clock signal CLK, clock enable signal CKE, row enable signal RE__, column enable signal CE__, write enable signal WE__, and chip select signal CS__. Control circuit 12 produces internal control signals, for example, row, sense, column, I/O, and speed detect enable signal SDEN for controlling internal peripheral logic circuits. Clock signal CLK and speed detect enable signal SDEN are coupled to speed detector circuit 10 for determining the circuit speed of the memory device subject to physical and device parameter variations.

Referring now to FIG. 2, there is a of speed detector circuit 10 of FIG. 1. The speed detector circuit includes a clock synchronizer reference circuit 200 for generating a reference signal. The reference signal is coupled to a delay circuit including delay stages 208, 212 and 216. This delay circuit is designed to emulate the circuit speed or propagation delay through a representative series of logic gates in a peripheral circuit of the 256 megabit synchronous DRAM. Moreover, the delay circuit is subjected to the same physical and device parameter variations as the peripheral circuit. Thus, the circuit speed of the delay circuit varies in real time with the speed of the peripheral circuit. A three-bit delay signal from the delay stages is coupled to a control circuit through CMOS transmission gates 220, 224 and 228. The control circuit, including inverters 248 and 254, AND gates 258, 260 and 262 and OR gate 265 produces control signals FAST, NORM and SLOW. As described below, these control signals are coupled to peripheral circuits to control their operation by compensating for variations in physical and device parameters. This compensation is highly advantageous in reducing speed and power variations between different devices as well as different operating conditions.

The operation of speed detector circuit 10 of FIG. 1 will be described in detail. Speed detector signal SDEN is initially low, clock signal CLK is initially high and CMOS transmission gates 220, 224 and 228 are on initially. Speed detector circuit 10 is enabled when speed detector enable signal SDEN goes high. A subsequent high-to-low transition of clock signal CLK is inverted and coupled to terminal 206 by clock synchronizer circuit 200. The resulting low-to-high transition at terminal 206 sequentially propagates through delay stages 208, 212 and 216. As the low-to-high transition propagates through delay stage 208, for example, the low-to-high transition of the output signal at terminal 210 is transmitted through CMOS transmission gate 220 to terminal 244 and latched by latch 238. The low-to-high transition at terminal 210 continues to propagate through the delay circuit until clock signal CLK makes a low-to-high transition. When clock signal CLK makes this low-to-high transition, CMOS transmission gates 220, 224 and 228 are turned off simultaneously by output signals from the clock synchronizer circuit 200 at terminals 202 and 204, respectively. The resulting delay signal stored by latches 238, 240 and 242 at terminals 244, 246 and 252, respectively, indicates the extent of propagation of the low-to-high transition of the signal at terminal 210 for the time clock signal CLK is low. The latched delay signal is decoded by a control circuit, including inverters 248 and 254 and AND gates 258, 260 and 262, to produce control signals FAST, NORM and SLOW, respectively. For example, control signal FAST is high and control signals NORM and SLOW are low when all three bits of the latched delay signal at terminals 244, 246 and 252 are high, indicating that the input signal at terminal 206 has propagated through all stages of the delay circuit to terminal 218.

The logical state of control signals FAST, NORM and SLOW is preserved by latches 238, 240 and 242 while speed detector enable signal SDEN remains high. A high-to-low transition of speed detector enable signal SDEN causes the clock synchronizer circuit 200 to reset latches 238, 240 and 242. Additionally, the clock synchronizer circuit 200 resets the delay circuit input signal at terminal 206 to a low logic level and enables CMOS transmission gates 220, 224 and 228, thereby resetting control signals FAST, NORM and SLOW to low logic levels. A subsequent circuit speed measurement begins with the next low-to-high transition of speed detector enable signal SDEN followed by a high-to-low transition of clock signal CLK.

Referring now to FIG. 3A and FIG. 3B, there is a power-up detector included in control circuit 12 and a corresponding timing diagram for generating speed detector enable signal SDEN. The power-up circuit includes series connected P-channel transistor 302 and N-channel transistors 306 and 310 for detecting a level of supply voltage $V_{PERI}$. When power is initially applied to the 256 megabit DRAM, $V_{PERI}$ begins increasing at time $t_0$ (FIG. 3B). Terminal 304 is initially held low, since complementary power-up signal PUP__ initially goes high with supply voltage $V_{PERI}$, thereby causing by N-channel transistors 306 and 310 to conduct. When supply voltage $V_{PERI}$ is at least a P-channel transistor threshold voltage greater than supply voltage $V_{ss}$, P-channel transistor 302 becomes conductive. When supply voltage $V_{PERI}$ reaches a sufficient level, the channel resistivity ratio of P-channel transistor 302 with N-channel transistors 306 and 310 is such that a voltage at terminal 304 exceeds a transition voltage of inverter 322. This voltage at terminal 304 causes a high-to-low transition of the output at terminal 324 at time $t_1$, thereby enabling NOR gate 334. This voltage at terminal 304 also turns on N-channel transistor 316 and enables NAND gate 326.

As supply voltage $V_{PERI}$ increases from time $t_0$, supply voltage $V_{BB}$ is pumped to a negative voltage with respect to supply voltage $V_{ss}$. When supply voltage $V_{BB}$ is at least an N-channel transistor threshold voltage less than supply voltage $V_{ss}$, N-channel transistor 320 becomes conductive. When supply voltage $V_{BB}$ reaches a sufficient level, the ratio of N-channel transistors 316 and 320 with P-channel transistor 312 is such that a voltage at terminal 314 falls below a transition voltage of NAND gate 332, thereby causing a high-to-low transition of an output of the latch formed by NAND gates 326 and 332 at terminal 328 at time $t_2$. This high-to-low transition at terminal 328 causes the output of NOR gate 334 at terminal 336 to go high, thereby generating complementary power-up signal PUP__ at terminal 340 and power-up signal PUP at terminal 344.

Inverters 346 and 352 and capacitor 350 form a delay circuit for delaying the propagation of the high-to-low transition of complementary power-up signal PUP__ to the input of NAND gate 356. Therefore, the low-to-high transition of power-up signal PUP renders both input terminals of NAND gate 356 high causing a high-to-low transition of speed detector enable signal SDEN at time $t_3$ (FIG. 3B). After the delay determined by inverters 346 and 352 and capacitor 350, the input of NAND gate 356 at terminal 354 goes low, causing a low-to-high transition of speed detector enable signal SDEN at time $t_4$. Thus, speed detector enable signal SDEN resets the speed detector circuit 10 in response to a power-up condition and prepares for an initial measurement of circuit speed.

Figure 4A:
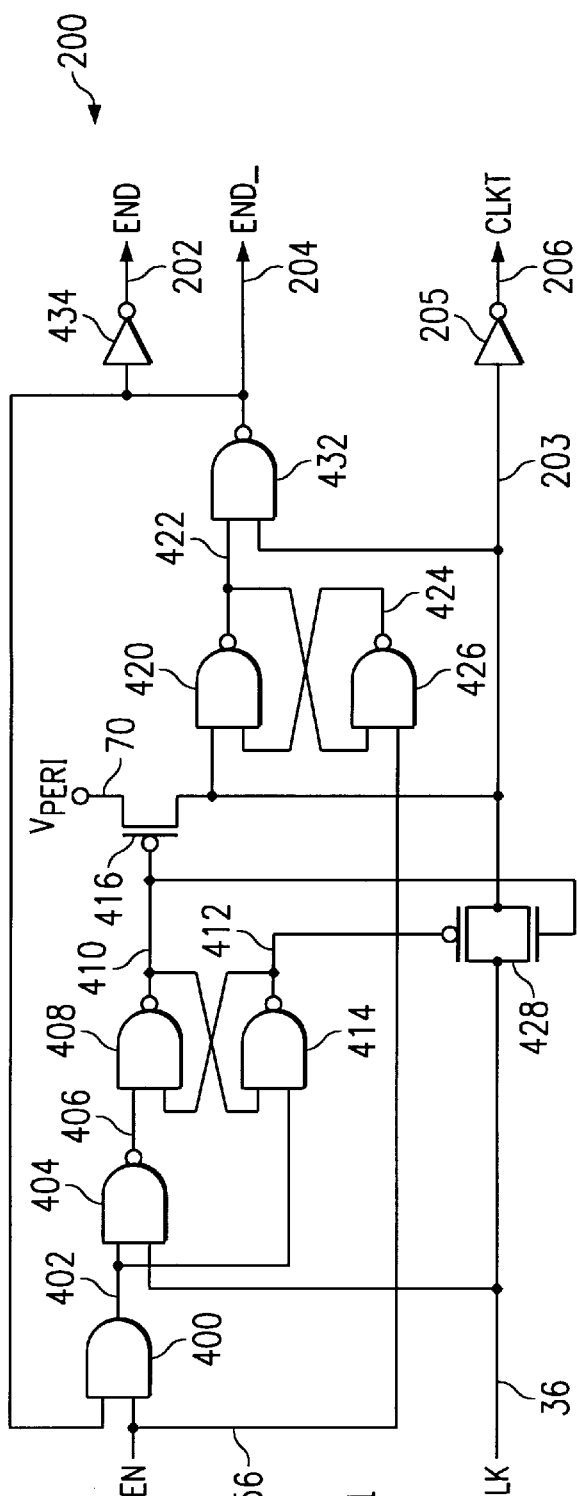
FIG. 4A is a schematic diagram of a clock synchronizer circuit of the speed detector circuit of FIG. 2.
Figure 4B:
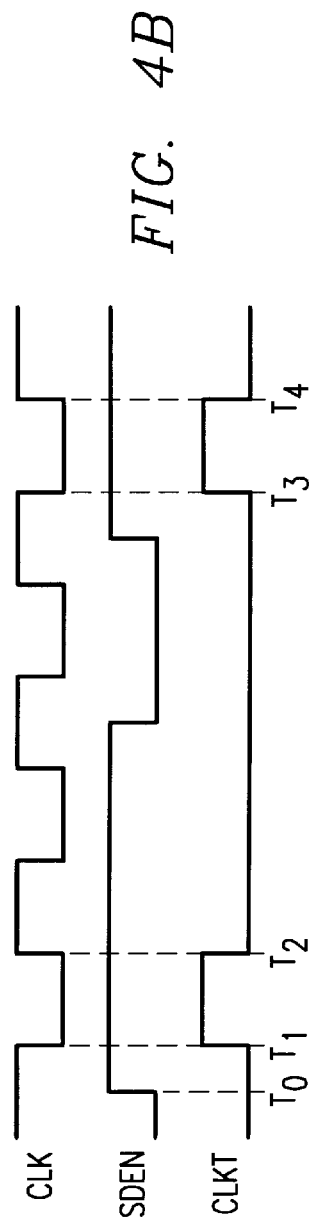
FIG. 4B is a timing diagram showing the operation of the clock synchronizer circuit of FIG. 4A.

Referring now to FIG. 4A and FIG. 4B, there is a clock synchronizer circuit of the speed detector circuit of FIG. 2 and a corresponding timing diagram for generating reference signal CLKT. Speed detector enable signal SDEN is initially low prior to time $T_0$ (FIG. 4B). This establishes an initial low state of the output at terminal 410 of the latch formed by NAND gates 408 and 414 without regard to the state of clock signal CLK. This low state at terminal 410 turns on P-channel transistor 416, thereby producing a logical high at terminal 203 and a logical low at terminal 422, the output of the latch formed by NAND gates 420 and 426. Inverter 205 inverts the signal at terminal 203, thereby producing reference signal CLKT at terminal 206. The low signal at terminal 422 establishes initial high and low states of complementary reference signal END_ and reference signal END, respectively.

At time $T_0$ (FIG. 4B) speed detector enable signal SDEN goes high. If clock signal CLK is also high, the output of NAND gate 404 goes low, thereby resetting the state of the latch formed by NAND gates 408 and 414. This reset condition turns P-channel transistor 416 off and CMOS transmission gate 428 on, thereby coupling clock signal CLK to the input terminal of inverter 205 and producing reference signal CLKT. A high-to-low transition of clock signal CLK at time $T_1$ resets the latch formed by NAND gates 420 and 426, thereby sending the signal at terminal 422 high and initiating a reference period for circuit speed measurement. A subsequent low-to-high transition of reference signal CLK at time $T_2$ causes complementary reference signal END_ and reference signal END to go low and high, respectively, thereby terminating the reference period for circuit speed measurement.

The high-to-low transition of reference signal END_ at time $T_2$ (FIG. 4B) causes the output of AND gate 400 at terminal 402 to go low, thereby setting the latch formed by NAND gates 408 and 414. This set state of the latch formed by NAND gates 408 and 414 turns off CMOS transmission gate 428 and turns on P-channel transistor 416, thereby holding the signal at terminal 203 high and reference signal CLKT low. In this state, subsequent transitions of clock signal CLK after time $T_2$ have no effect on reference signal CLKT. Speed detect enable signal SDEN must make a low-going pulse followed by another high-to-low transition of clock signal CLK to initiate a subsequent circuit speed measurement reference period between times $T_3$ and $T_4$ (FIG. 4B). This is highly advantageous since initial circuit speed measurement may be performed immediately after power-up to compensate for variations in physical and device parameters. Moreover, this circuit speed measurement and corresponding compensation is performed in a single cycle. Thus, circuit variations are minimized before read or write operations are permitted by power-up signal PUP.

Figure 5A:
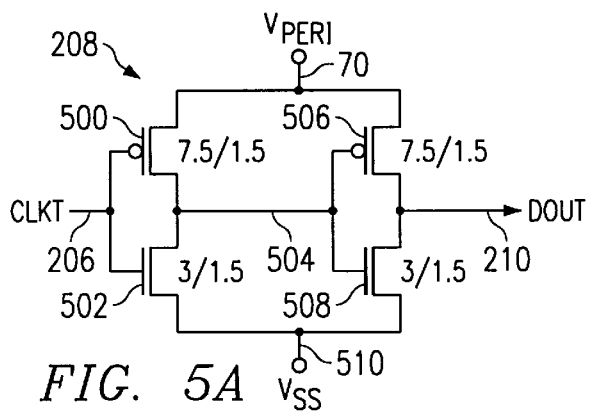
FIG. 5A is a diagram of an embodiment of the delay stage of the speed detector circuit of FIG. 2.

Referring now to FIG. 5A, there is an embodiment of the delay stage of the speed detector circuit of FIG. 2. P-channel transistor 500 and N-channel transistor 502 form an inverter for receiving reference signal CLKT. The output of this inverter at terminal 504 is coupled to another inverter formed by P-channel transistor 506 and N-channel transistor 508. Output signal DOUT at terminal 210 is then coupled to a subsequent delay stage. The delay of these series-connected inverters is effected by the 1.5 μm channel length of the transistors. This 1.5 μm channel length greatly increases the resistance and gate capacitance of each transistor compared to a standard 0.5 μm channel length, thereby providing a greater gate delay than a standard inverter of the 256 megabit DRAM.

Figure 5B:
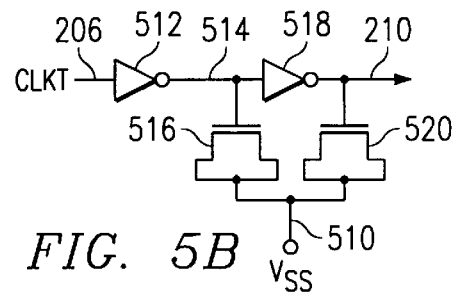
FIG. 5B is a diagram of another embodiment of the delay stage of the speed detector circuit of FIG. 2.

Referring now to FIG. 5B, there is another embodiment of the delay stage of the speed detector circuit of FIG. 2. Series-connected inverters 512 and 518 are standard size logic gates. The delay of these series-connected inverters is effected by the gate oxide capacitors 516 and 520. These gate oxide capacitors preferentially increase the delay of the delay stage with decreasing gate oxide thickness. This embodiment of the delay stage offers an advantage that circuit speed measurement is more sensitive to the gate oxide device parameter than to other device parameters. Thus, peripheral circuits that are more sensitive to gate oxide thickness variations than, for example, transistor threshold voltage or transistor gate length variations, may be selectively compensated according to this embodiment of the instant invention.

Figure 5C:
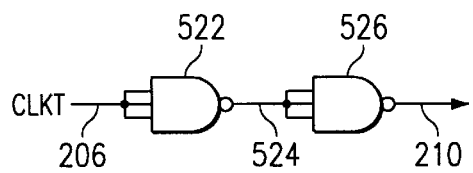
FIG. 5C is a diagram of yet another embodiment of the delay stage of the speed detector circuit of FIG. 2.

Referring now to FIG. 5C, there is yet another embodiment of the delay stage of the speed detector circuit of FIG. 2. Series-connected NAND gates 522 and 526 are standard size logic gates. When connected in a common input configuration, the NAND gates function as inverters. The delay of these series-connected NAND gates is effected by an increase in gate oxide capacitance and a corresponding reduction in drive strength due to three series-connected N-channel transistors in each NAND gate. These series-connected NAND gates preferentially increase the delay of the delay stage with increasing transistor gate length and transistor threshold voltage variations. This embodiment of the delay stage offers an advantage that circuit speed measurement is more sensitive to small polycrystalline silicon gate length variations than to other device parameters. Thus, peripheral circuits that are more sensitive to transistor threshold voltage or transistor gate length variations than, for example, gate oxide thickness variations, may be selectively compensated according to this embodiment of the instant invention.

Figure 6:
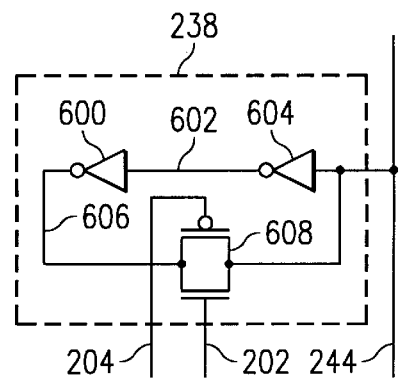
FIG. 6 is a diagram of an embodiment of the latch circuit of the speed detector circuit of FIG. 2.

Referring now to FIG. 6, there is a latch circuit 238 of the speed detector circuit of FIG. 2. In operation, CMOS transmission gate 608 is coupled to complementary reference signals at terminals 202 and 204 so as to ensure that it is off when CMOS transmission gate 220 (FIG. 2) is on. When the latch circuit is inactive, the reference signals at terminals 202 and 204 (FIG. 6) are low and high, respectively, and CMOS transmission gate 608 is off. The signal at terminal 244 is inverted twice by series-connected inverters 604 and 600, thereby producing the same logical signal at terminal 606. The latch circuit is activated when the reference signals at terminals 202 and 204 are high and low, respectively. In the active state, and CMOS transmission gate 608 is on and inverters 600 and 604 are cross-coupled, thereby latching the signal at terminal 244.

Figure 7:
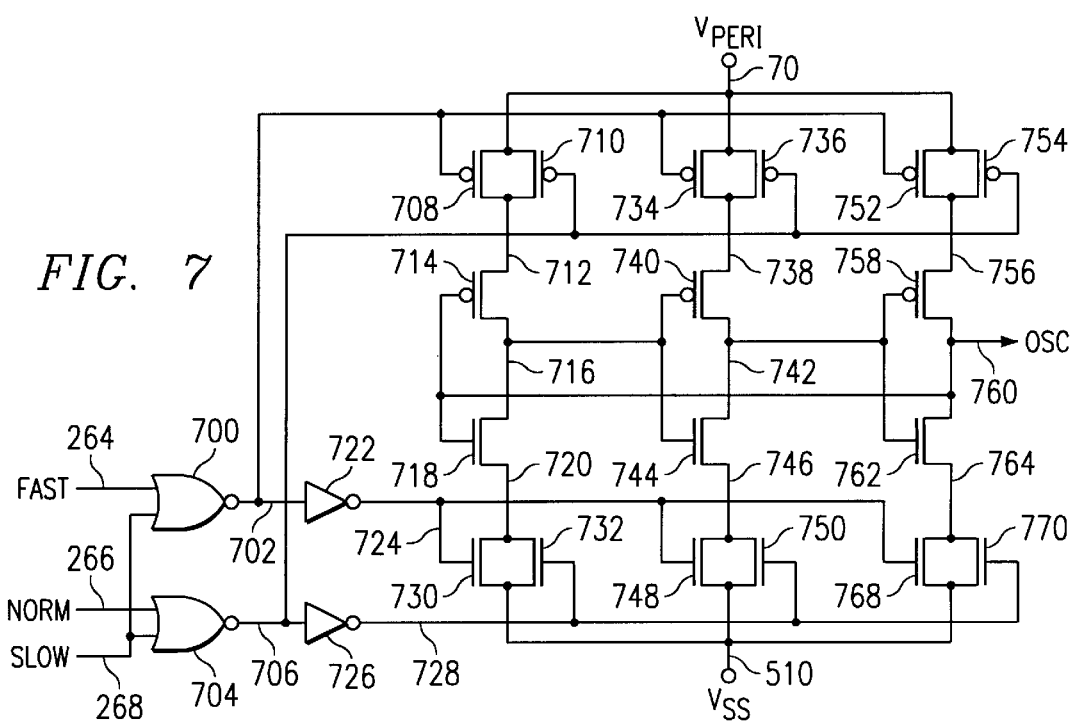
FIG. 7 is a diagram of an embodiment of an oscillator circuit of the present invention.

Referring now to FIG. 7, there is a diagram of an embodiment of an oscillator circuit of the present invention as might be used, for example, for reference supply $V_{BB}$. The oscillator circuit includes three inverting stages producing output signals at terminals 716, 742 and 760. The function of each oscillator stage is substantially the same, so only the first stage, producing an output signal at terminal 716 will be described in detail. The first inverting stage includes transistors 714 and 718, having a common gate connection at input terminal 760 and a common drain connection at output terminal 716. A parallel combination of P-channel control transistors 708 and 710 is connected between the source of P-channel transistor 714 and supply voltage $V_{PERI}$ for controlling the series resistance of the inverting stage during a low-to-high transition at output terminal 716. A parallel combination of N-channel control transistors 730 and 732 is connected between the source of N-channel transistor 718 and supply voltage $V_{SS}$ for controlling the series resistance of the inverting stage during a high-to-low transition at output terminal 716. NOR gates 700 and 704 and inverters 722 and 726 receive control signals FAST, NORM and SLOW for selectively activating control transistors 708, 710, 730 and 732.

In operation, when control signal SLOW is high and control signals FAST and NORM are low, the signals at terminals 702 and 706 are low, thereby activating control transistors 708 and 710 and providing a minimum series resistance between supply voltage terminal 70 and output terminal 716. In a similar manner, the signals at terminals 724 and 728 are high, thereby activating control transistors 730 and 732 and providing a minimum series resistance between supply voltage terminal 510 and output terminal 716. Thus, when control signal SLOW is high, the series resistance of each inverting stage is minimized and the oscillator frequency is maximized to compensate for a slower circuit speed.

Alternatively, when control signal FAST is high and control signals SLOW and NORM are low, the signals at terminals 702 and 728 are low, and the signals at terminals 706 and 724 are high, thereby activating only control transistors 708 and 730. Control transistors 708 and 730 have less drive strength than control transistors 710 and 732, respectively. Thus, when control signal FAST is high, the series resistance of each inverting stage is maximized and the oscillator frequency is minimized to compensate for a faster circuit speed.

Finally, when control signal NORM is high and control signals SLOW and FAST are low, only control transistors 710 and 732 are activated. The series resistance of each inverting stage and the corresponding oscillator frequency have values that are between the values for fast and slow circuit speeds. This variable frequency operation is highly advantageous in providing compensation for physical and device parameter variations. Power is conserved for fast circuit operation, since the oscillator circuit is not operated at a needlessly high frequency. Correspondingly, circuit efficiency is preserved for slow circuit operation, since the oscillator circuit frequency is increased.

Figure 8:
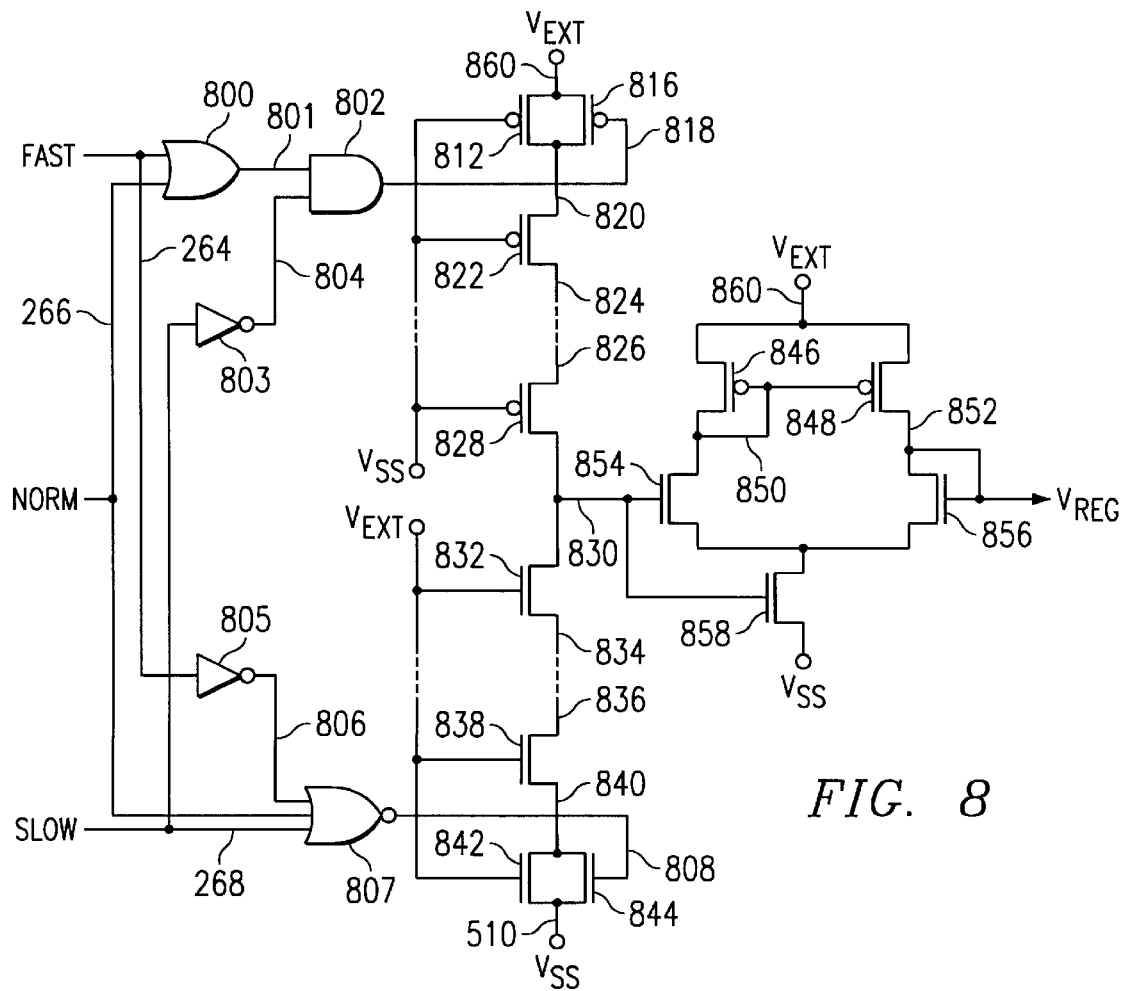
FIG. 8 is a diagram of an embodiment of a voltage regulator of the present invention.

Referring now to FIG. 8, there is a diagram of an embodiment of a voltage regulator circuit of the present invention as might be used, for example, for generating regulated voltage $V_{REG}$. The voltage regulator circuit includes a current mirror circuit formed by P-channel transistors 846 and 848. N-channel transistor 858 is a common source resistance for input transistors 854 and 856. Input transistors 854 and 856 vary in conductivity with a difference voltage between regulated voltage $V_{REG}$ and a reference voltage at terminal 830. Thus, regulated voltage $V_{REG}$ varies with the reference voltage at terminal 830.

The reference voltage at terminal 830 is developed by a resistive voltage divider circuit including series-connected P-channel transistors 812, 822 and 828, series-connected N-channel transistors 832, 838 and 842 and control transistors 816 and 844. When enabled, P-channel control transistor 816 is much more conductive than P-channel transistor 812, and N-channel control transistor 844 is much more conductive than N-channel transistor 842.

In operation, when control signal NORM is high and control signals FAST and SLOW are low, the output of OR gate 800 at terminal 801 and the output of inverter 803 at terminal 804 are high. The output of AND gate 802 is high and P-channel control transistor 816 is off. The high state of control signal NORM also ensures that the output of NOR gate 807 at terminal 808 is low, thereby turning off control transistor 844. Thus, series-connected P-channel transistors and N-channel transistors produce a normal reference voltage at terminal 830 and a normal regulated voltage $V_{REG}$ at terminal 852.

When control signal FAST is high and control signals NORM and SLOW are low, P-channel control transistor 816 remains off, but N-channel control transistor 844 is turned on, thereby effectively shunting N-channel transistor 842. This reduces the reference voltage at terminal 830 and the regulated voltage $V_{REG}$ at terminal 852. This reduced voltage reduces the circuit speed and power consumption to compensate for the faster circuit speed measured by speed detector circuit 10 (FIG. 1). Alternatively, when control signal SLOW is high and control signals NORM and FAST are low, P-channel control transistor 816 is turned on, and N-channel control transistor 844 remains off, thereby effectively shunting P-channel transistor 812. This increases the reference voltage at terminal 830 and the regulated voltage $V_{REG}$ at terminal 852. This increased voltage increases the circuit speed and power consumption to compensate for the slower circuit speed measured by speed detector circuit 10 (FIG. 1). This compensation is highly advantageous because it reduces the variation in operating speed and power consumption of the integrated circuit for variations in device or physical characteristics.

Figure 9:
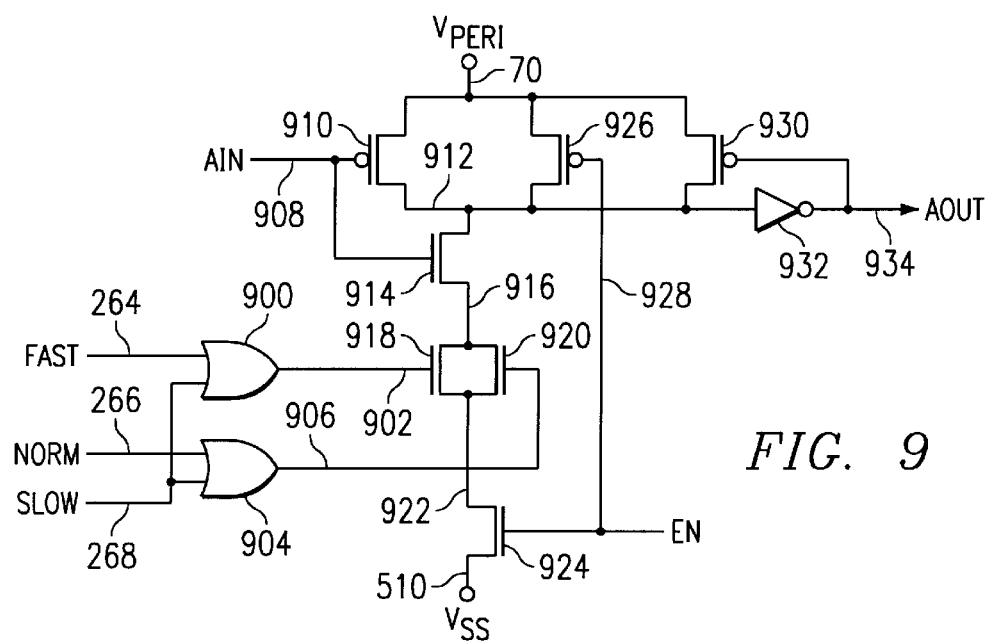
FIG. 9 is a diagram of an embodiment of an input buffer of the present invention.

Referring now to FIG. 9, there is a diagram of an embodiment of an input buffer of the present invention. The input buffer receives input signal AIN and produces output signal AOUT. Output signal AOUT varies between supply voltages $V_{PERI}$ and $V_{SS}$. Input signal AIN, however, is supplied from an external source and may be a voltage intermediate supply voltages $V_{PERI}$ and $V_{SS}$. A determination of whether input signal AIN is a logical one or a logical zero is made by the conductivity ratio of P-channel transistors 910, 926 and 930 to N-channel transistors 914, 918, 920 and 924. Where the conductivity ratio is not high enough to elevate the voltage at terminal 912 above a transition voltage of inverter 932, output signal AOUT is high. Alternatively, where the conductivity ratio, responsive to input signal AIN, is high enough to elevate the voltage at terminal 912 above the transition voltage of inverter 932, output signal AOUT goes low.

In operation, where N-channel transistor conductivity is a dominant device parameter in circuit speed determination, N-channel control transistors 918 and 920 control the conductivity ratio of the input buffer. When control signal NORM is high and control signals FAST and SLOW are low, N-channel control transistor 920 is turned on, but N-channel control transistor 918 is turned off. N-channel transistor 920 has a higher conductivity than N-channel transistor 918 and establishes a normal input buffer conductivity ratio.

When control signal FAST is high and control signals NORM and SLOW are low, indicating high N-channel transistor conductivity, N-channel control transistor 918 is turned on, and N-channel control transistor 920 is turned off. This forms a current path between terminal 912 and supply voltage terminal 510 that is more resistive than normal, and increases the conductivity ratio to compensate for selectively higher N-channel transistor conductivity. When control signal SLOW is high and control signals NORM and FAST are low, indicating low N-channel transistor conductivity, N-channel control transistors 918 and 920 are both turned on. This forms a less resistive current path between terminal 912 and supply voltage terminal 510 than normal and decreases the conductivity ratio of the input buffer. This compensation is highly advantageous in maintaining a stable input level determination with variations in device and physical parameters.

Figure 10:
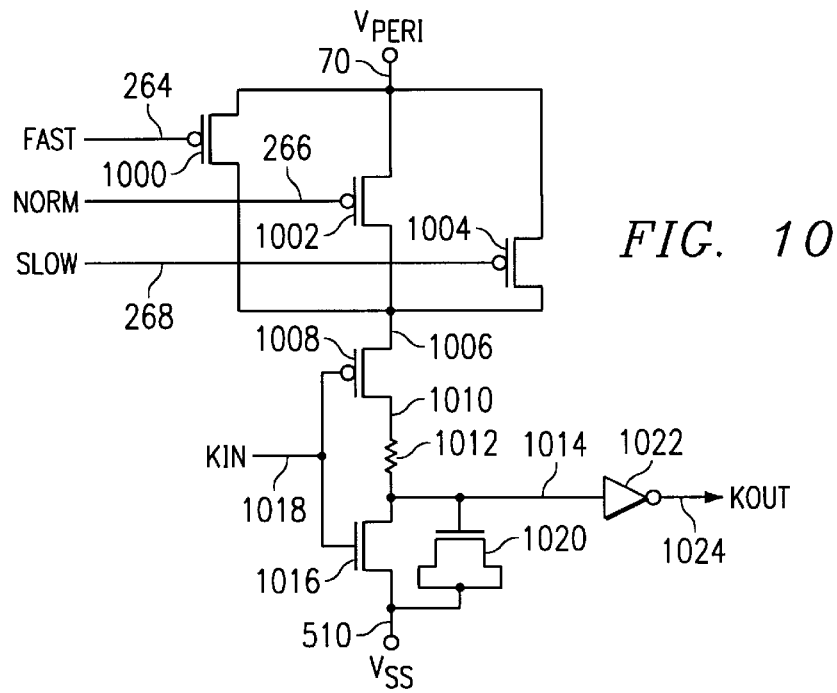
FIG. 10 is a diagram of an embodiment of a peripheral delay stage of the present invention.

Referring now to FIG. 10, there is a diagram of an embodiment of a peripheral delay stage of the present invention. Such peripheral delay stages are used to precisely control timing of internal control signals of the integrated circuit. P-channel control transistors 1000, 1002 and 1004 control the resistance of a current path between supply voltage $V_{PERI}$ and terminal 1014. P-channel control transistor 1000 is most conductive and P-channel control transistor 1004 is least conductive. When input signal KIN is high, P-channel transistor 1008 is off, terminal 1014 is coupled to terminal 510 through transistor 1016 and output signal KOUT is high. When control signal NORM is high and control signals FAST and SLOW are low, P-channel control transistors 1000 and 1004 are turned on, but P-channel control transistor 1002 is turned off. This establishes a normal resistance of the current path for charging capacitor 1020 through transistor 1008 and resistor 1012.

In normal operation, when input signal KIN makes a transition from high-to-low, P-channel transistor 1008 turns on and current flows through P-channel transistors 1000, 1004 and 1008 and resistor 1012 to charge capacitor 1020. After a normal delay, when the voltage at terminal 1014 reaches a transition voltage of inverter 1022, output signal KOUT goes low. When control signal FAST is high and control signals NORM and SLOW are low, however, P-channel control transistor 1000 is off and P-channel control transistors 1002 and 1004 are on, thereby increasing the resistance of the current path and the resulting delay from the norm. Alternatively, when control signal SLOW is high and control signals NORM and FAST are low, P-channel control transistor 1004 is off and P-channel control transistors 1000 and 1002 are on, thereby decreasing the resistance of the current path and the resulting delay from the norm. Thus, the peripheral delay stage is compensated for variations in device and physical parameter variations as determined by speed detector circuit 10 (FIG. 1).

Figure 11A:
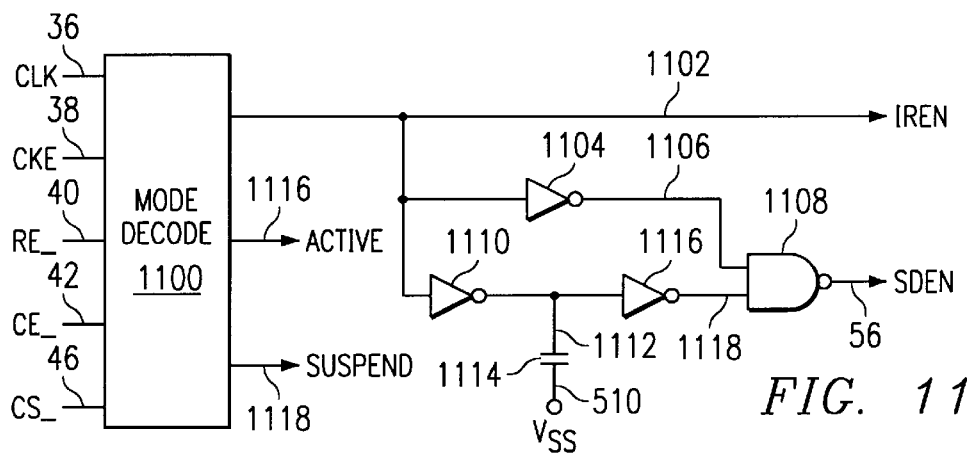
FIG. 11A is a diagram of an embodiment of the present invention for activating the speed detector circuit of FIG. 2 in response to an internal refresh signal.
Figure 11B:
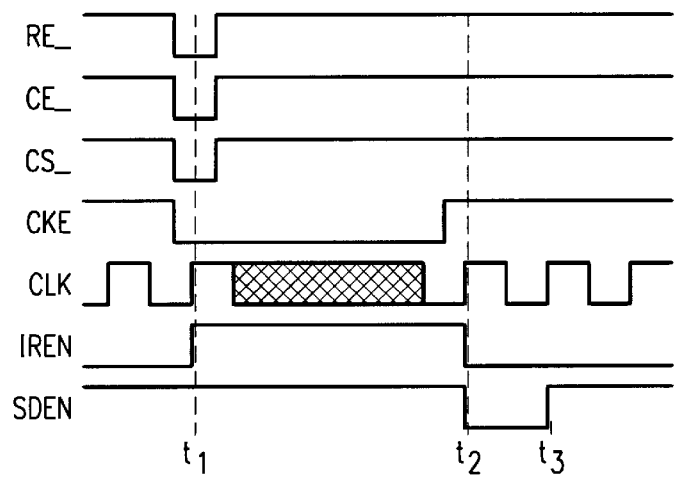
FIG. 11B is a timing diagram of the circuit of FIG. 11A showing the activation of the speed detector circuit of FIG. 2 in response to an internal refresh signal.

Although embodiments of the invention have been described in detail with reference to preferred embodiments, it is to be understood that the foregoing description is by way of example only and is not to be construed in a limiting sense. For example, speed detect enable signal SDEN may be generated by various internal signals, either alone or in combination, to repeat circuit speed measurements at any time during the operation of the integrated circuit. Referring now to FIG. 11A and FIG. 11B, there is a schematic diagram of another embodiment of the present invention and a corresponding timing diagram, respectively, for activating the speed detector circuit of FIG. 2 in response to an internal refresh signal. In operation, internal refresh signal IREN goes high at time $t_1$ (FIG. 11B) to initiate an internal refresh cycle, responsive to external signals RE, CE_, CS_, CKE and CLK. The internal refresh cycle is completed at time $t_2$ when internal refresh signal IREN goes low. This high-to-low transition of internal refresh signal IREN causes the output of inverter 1104 at terminal 1106 to go high (FIG. 11A). Both inputs of NAND gate 1108 are temporarily high causing speed detect enable signal SDEN to go low at time $t_2$ and reset the speed detector circuit (FIG. 2). After a predetermined delay established by inverters 1110 and 1116 and capacitor 1114 (FIG. 11A), the signal at terminal 1118 goes low, thereby causing speed detect enable signal SDEN to go high at time $t_3$ (FIG. 11B) and begin a new measurement of circuit speed. This new speed measurement with each internal refresh cycle offers the advantage of continually monitoring and compensating for any change of circuit speed with changes in operating voltage or temperature. Thus, device operation is stabilized over a wide range of operating conditions.

Referring now to FIG. 11C, there is a timing diagram of the circuit of FIG. 11A showing the activation of the speed detector circuit of FIG. 2 in response to a suspend mode signal. Operation of the circuit is the same as previously described except that the circuit consisting of inverters 1104, 1110 and 1116, capacitor 1114 and NAND gate 1108 is connected to terminal 1118 rather than terminal 1102. External signals cause the integrated circuit to enter a suspend mode after time $t_2$ (FIG. 11C). The integrated circuit exits the suspend mode at time $t_4$, thereby causing speed detect enable signal SDEN to go low and reset the speed detector circuit 10 (FIG. 2). After a predetermined delay, speed detect enable signal SDEN goes high at time $t_5$ (FIG. 11B), thereby initiating a new measurement of circuit speed. This new speed measurement occurs when the integrated circuit exits a suspend mode offering the advantage of compensating for any change of circuit speed while operation was suspended.

Referring now to FIG. 12, there is a diagram of another embodiment of the present invention for activation of the speed detector circuit of FIG. 2 in response to a counter signal. Multiplex gate 1204 selects external clock signal CLK or oscillator 1200 output signal at terminal 1202, responsive to a select signal at terminal 1208. An n-stage counter 1210 counts each cycle of the signal at the multiplex gate output terminal 1206 and produces a high output signal at terminal 1212 after $2^n$ cycles. This high output causes speed detect enable signal SDEN to go low and reset the speed detector circuit 10 (FIG. 2) as previously described. Additionally, the high output at terminal 1212 resets the n-stage counter 1210 to begin another count. After a delay determined by inverters 1214, 1218 and 1222 and capacitor 1224, speed detect enable signal SDEN goes high and begins a new measurement of circuit speed.

Referring now to FIG. 13A and 13B there are diagrams of other embodiment of the present invention for activation of the speed detector circuit of FIG. 2 in response to a low power signal or a sleep mode signal respectively. Each of these embodiments offers the advantage of initiating a new circuit speed measurement when external conditions indicate a change in supply voltage by a computer system that would employ the integrated circuit. In particular, the circuit of FIG. 13B may be used to decode a power management bus 1320 of the computer system with decode circuit 1322 to produce several power management signals such as ACTIVE or SLEEP for controlling the integrated circuit. Any of these control signals may be used either individually or logically combined by techniques that are well known to those having ordinary skill in the art.

Figure 14:
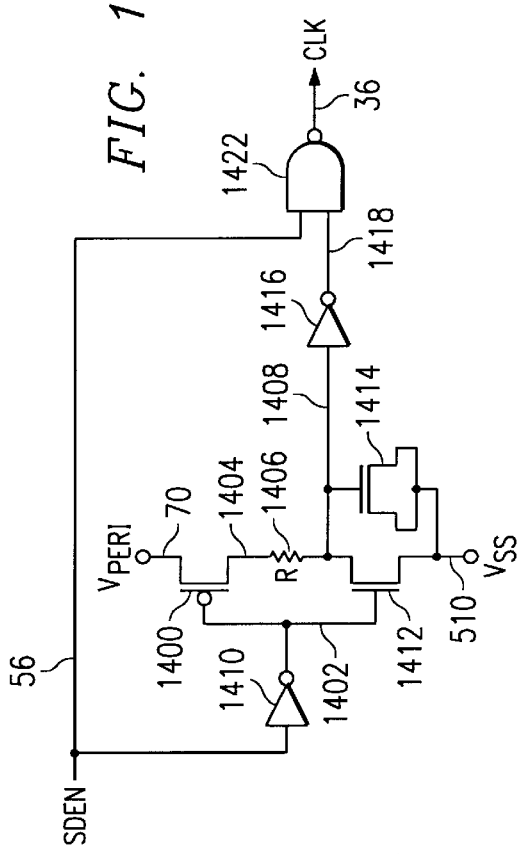
FIG. 14 is a diagram of an embodiment of the present invention for generating a reference period for the clock synchronizer of FIG. 4A.

Referring now to FIG. 14, there is a diagram of yet another embodiment of the present invention for generating a reference period for the clock synchronizer of FIG. 4A. The reference period begins with a low-to-high transition of speed detect enable signal SDEN, thereby causing the output signal CLK of NAND gate 1422 at terminal 36 to go low. In response to the low-to-high transition of speed detect enable signal SDEN, the output of inverter 1410 at terminal 1402 goes low activating P-channel transistor 1400. Capacitor 1414 is charged through P-channel transistor 1400 and resistor 1406 to a transition voltage of inverter 1416. Subsequently the output of inverter 1416 goes low causing the output signal CLK of NAND gate 1422 at terminal 36 to go high. This low-to-high transition of output signal CLK terminates the circuit speed measurement period.

Figure 15:
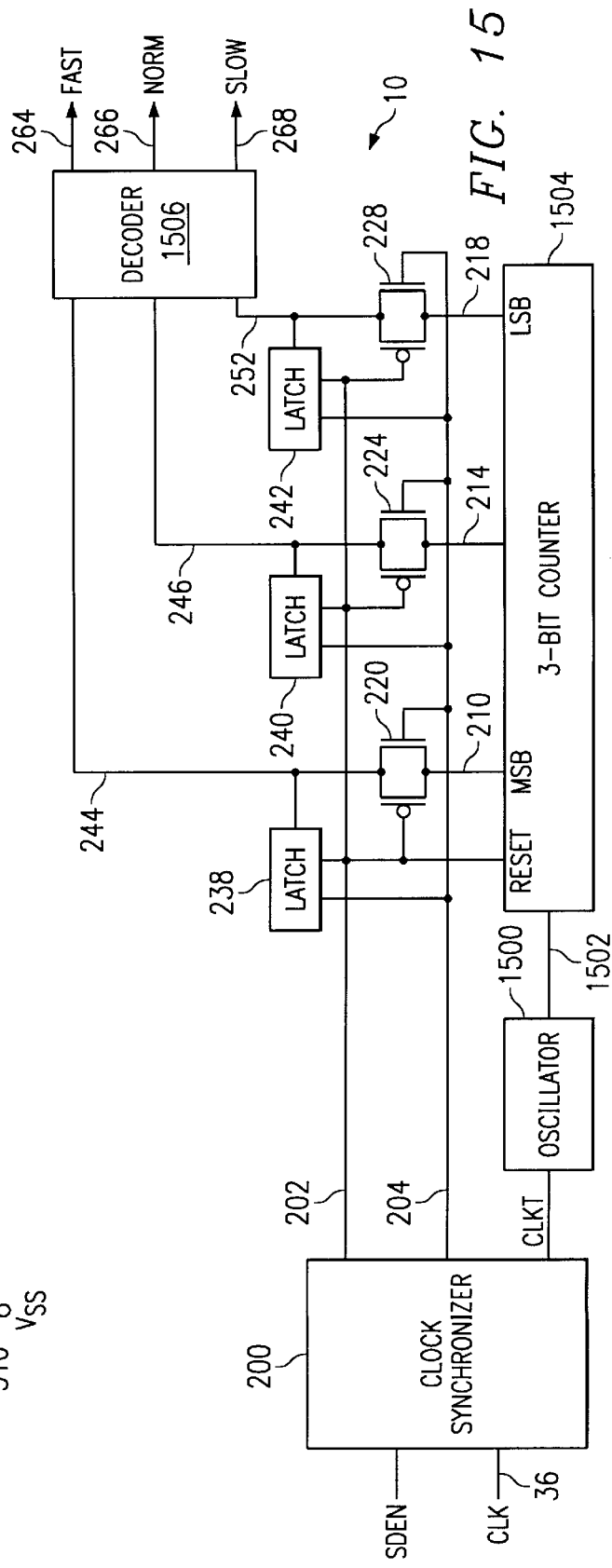
FIG. 15 is a diagram of another embodiment of a speed detector circuit of the 256 megabit dynamic random access memory of FIG. 1 according to the instant invention.

Referring now to FIG. 15, there is a diagram of yet another embodiment of a speed detector circuit of the 256 megabit dynamic random access memory of FIG. 1 according to the instant invention. This embodiment is similar in operation to the speed detector previously described in FIG. 2 except that 3-bit counter 1504 is substituted for the series of delay stages 208, 212 and 216 (FIG. 2). Additionally, signal CLKT at terminal 206 enables oscillator 1500. An output of oscillator 1500 at terminal 1502 provides an input to the 3-bit counter 1504.

In operation, signal CLKT enables oscillator 1500 which produces a series of clock cycles which are counted by 3-bit counter 1504. Oscillator 1500 is designed to emulate particular features of the integrated circuit during speed measurement. Upon termination of a circuit speed reference period, the counter output bits are loaded into latches 238, 240 and 242. Contents of the latches are decoded by decoder 1506 to produce control signals FAST, NORM and SLOW as described previously. This embodiment is highly advantageous for greater resolution of circuit speed measurement. Moreover, the number of stages of counter 1504 may be extended beyond 3 bits and the frequency of oscillator increased to further increase resolution.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit responsive to an operating condition comprising:
   a reference circuit for generating a reference signal, the reference signal determining a reference period;
   a delay circuit responsive to the reference signal for producing a delay signal having a delay, the delay varying with a change in the operating condition;
   a latch circuit coupled to the delay circuit for latching the delay signal in response to a signal corresponding to the operating condition; and
   a control circuit responsive to the delay signal for producing a control signal.

2. A circuit as in claim 1 wherein the signal corresponding to the operating condition is a power up signal.

3. A circuit as in claim 1 wherein the signal corresponding to the operating condition is an internal refresh signal.

4. A circuit as in claim 1 wherein the signal corresponding to the operating condition is a suspend mode signal.

5. A circuit as in claim 1 further comprising a terminal for receiving an external signal, the external signal producing the signal corresponding to the operating condition, the latch circuit latching the delay signal responsive to the external signal.

6. A circuit as in claim 5 wherein the external signal is a power management signal.

7. A circuit as in claim 5 wherein the external signal is a low power signal.

8. A circuit as in claim 1, further comprising a counter circuit for counting a predetermined number of clock cycles, the counter circuit producing the signal corresponding to the operating condition responsive to the predetermined number of clock cycles.

9. A circuit comprising:
   a reference circuit arranged to produce a reference signal corresponding to a reference period;
   a delay circuit coupled to receive the reference signal, the delay circuit arranged to produce a delay signal;
   a decode circuit coupled to receive the delay signal, the decode circuit arranged to decode the delay signal for producing a control signal; and
   an oscillator circuit arranged to produce an output signal having a frequency of oscillation, the oscillator circuit responsive to the control signal for controlling the frequency of oscillation.

10. A circuit as in claim 1 wherein the control signal has a first logic state, responsive to a first operating condition, and a second logic state, responsive to a second operating condition.

11. A circuit as in claim 10 wherein a second frequency of oscillation of the oscillator circuit, responsive to the second logic state and the second operating condition, is greater than a first frequency of oscillation of the oscillator circuit, responsive to the first logic state and the first operating condition, and less than a third frequency of oscillation of the oscillator circuit, responsive to the first logic state and the second operating condition.

12. A circuit as in claim 10 wherein the first operating condition is a first value of an external voltage and the second operating condition is a second value of the external voltage.

13. A circuit as in claim 10 wherein the first operating condition is a first temperature and the second operating condition is a second temperature.

14. A circuit as in claim 10 wherein the first operating condition is a first polycrystalline silicon gate length and the second operating condition is a second polycrystalline silicon gate length.

15. A circuit as in claim 10 wherein the first operating condition is a first gate oxide thickness and the second operating condition is a second gate oxide thickness.

16. A circuit as in claim 10 wherein the first operating condition is a first transistor threshold voltage and the second operating condition is a second transistor threshold voltage.

17. A circuit as in claim 1 further comprising a latch circuit coupled to the decode circuit for latching the delay signal.

18. A circuit as in claim 17 wherein the reference circuit receives an external signal for generating the reference signal.

19. A circuit as in claim 17 wherein the reference circuit generates the reference signal responsive to a plurality of circuit delay elements.

20. A circuit as in claim 19 wherein the circuit delay elements comprise a resistor and a capacitor.

21. A circuit as in claim 17 wherein the delay circuit comprises a plurality of delay stages, each delay stage producing an output signal having a delay, the delay of each delay stage varying with the speed of the circuit.

22. A circuit as in claim 17 wherein the decode circuit receives the output signal from each of the delay stages for producing the control signal, the control signal having a plurality of logic states, each logic state corresponding to a different speed of the circuit.

23. A circuit comprising:
   a reference circuit arranged to produce a reference signal corresponding to a reference period;
   a delay circuit coupled to receive the reference signal, the delay circuit arranged to produce a delay signal;
   a decode circuit coupled to receive the delay signal, the decode circuit arranged to decode the delay signal for producing a control signal; and
   a voltage regulator circuit arranged to produce a regulated voltage, the voltage regulator circuit responsive to the control signal for controlling the regulated voltage.

24. A circuit as in claim 23 wherein a second regulated voltage of the voltage regulator circuit, responsive to a second logic state of the control signal and a second operating condition, is greater than a first regulated voltage of the voltage regulator circuit, responsive to a first logic state of the control signal and a first operating condition, and less than a third regulated voltage of the voltage regulator circuit, responsive to the first logic state and the second operating condition.

25. A circuit comprising:
   a reference circuit arranged to produce a reference signal corresponding to a reference period;
   a delay circuit coupled to receive the reference signal, the delay circuit arranged to produce a delay signal;
   a decode circuit coupled to receive the delay signal, the decode circuit arranged to decode the delay signal for producing a control signal; and
   an input buffer circuit for detecting an input voltage, the input buffer circuit responsive to the control signal for controlling the detecting of the input voltage.

26. A circuit as in claim 25 wherein a second detected input voltage of the input buffer circuit, responsive to a second logic state of the control signal and a second operating condition, is greater than a first detected input voltage of the input buffer circuit, responsive to a first logic state of the control signal and a first operating condition, and less than a third detected input voltage of the input buffer circuit, responsive to the first logic state and the second operating condition.

27. A circuit comprising:
   a reference circuit arranged to produce a reference signal corresponding to a reference period;
   a delay circuit coupled to receive the reference signal, the delay circuit arranged to produce a delay signal;
   a decode circuit coupled to receive the delay signal, the decode circuit arranged to decode the delay signal for producing a control signal; and
   a peripheral delay circuit for delaying a peripheral signal, the peripheral delay circuit responsive to the control signal for controlling the delaying of the peripheral signal.

28. A circuit as in claim 27 wherein a second delay of the peripheral signal of the peripheral delay circuit, responsive to a second logic state of the control signal and a second operating condition, is greater than a first delay of the peripheral signal of the peripheral delay circuit, responsive to a first logic state of the control signal and a first operating condition, and less than a third delay of the peripheral signal of the peripheral delay circuit, responsive to the first logic state and the second operating condition.

* * * * *